(12) United States Patent
Dees et al.

(10) Patent No.: US 8,199,149 B2
(45) Date of Patent: Jun. 12, 2012

(54) AUTOMATIC GENERATION OF FREQUENCY DOMAIN MASK

(75) Inventors: Ian S. Dees, Aloha, OR (US); Craig D. Bryant, Portland, OR (US); Lynne A. Fitzsimmons, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 675 days.

(21) Appl. No.: 11/956,140

(22) Filed: Dec. 13, 2007

(65) Prior Publication Data

US 2009/0153559 A1 Jun. 18, 2009

(51) Int. Cl.
*G06T 11/20* (2006.01)
(52) U.S. Cl. ...................................................... 345/440
(58) Field of Classification Search ................ 345/440.1
See application file for complete search history.

(56) References Cited

U.S. PATENT DOCUMENTS

| | | | | |
|---|---|---|---|---|
| 4,868,785 A * | 9/1989 | Jordan et al. | ................... | 345/440 |
| 5,155,836 A * | 10/1992 | Jordan et al. | ................... | 703/23 |
| 5,359,705 A * | 10/1994 | Thomason et al. | ............ | 345/593 |
| 5,371,517 A * | 12/1994 | Izzi et al. | ...................... | 345/589 |
| 6,424,749 B1 * | 7/2002 | Zhu et al. | ...................... | 382/260 |
| 7,072,523 B2 * | 7/2006 | Bolle et al. | .................... | 382/254 |
| 7,159,187 B2 * | 1/2007 | Bernard et al. | ............... | 715/771 |
| 7,283,674 B2 * | 10/2007 | Bai et al. | ........................ | 382/232 |
| 7,541,116 B2 * | 6/2009 | Lin | .................... | 430/5 |
| 2003/0085897 A1 * | 5/2003 | Shubert et al. | ................. | 345/440 |
| 2003/0156673 A1 * | 8/2003 | Yanai | ........................... | 375/371 |
| 2003/0161545 A1 * | 8/2003 | Gallagher | ..................... | 382/266 |
| 2005/0231292 A1 * | 10/2005 | Akahori et al. | ................. | 331/16 |
| 2008/0013801 A1 * | 1/2008 | Reed et al. | ..................... | 382/118 |
| 2008/0181477 A1 * | 7/2008 | Izatt et al. | ...................... | 382/128 |
| 2009/0153559 A1 * | 6/2009 | Dees et al. | ................. | 345/440.1 |
| 2009/0244636 A1 * | 10/2009 | Nisper et al. | ................. | 358/3.26 |
| 2010/0150218 A1 * | 6/2010 | Yaginuma et al. | ............ | 375/226 |

FOREIGN PATENT DOCUMENTS

EP          1089079 A2      4/2001

OTHER PUBLICATIONS

Femtosecond pulse shaping for synthesis, processing, and time-to-space conversion of ultrafast optical waveforms Weiner, A.M.; Kan'an, A.M.;Selected Topics in Quantum Electronics, IEEE Journal of vol. 4, Issue: 2 Digital Object Identifier: Year: 1998, pp. 317-331.*
Anonymous: "User's Guide, DS1000 Series Digital Oscilloscopes" [Online] Oct. 31, 2007, XP002584811, Rigol Technologies, Inc., available at http://www.rigol.com/download/english/DS1000_User%27s_Guide_DS1-071026.pdf.

* cited by examiner

*Primary Examiner* — Javid Amini
(74) *Attorney, Agent, or Firm* — Matthew D. Rabdau; Michael A. Nelson (57) ABSTRACT

Automatic generation of a frequency domain mask is achieved by drawing a reduced waveform representing frequency domain data for an input signal as a pixel map. The reduced waveform is blurred by applying a user selected frequency offset, and from the blurred waveform data points are selected to generate upper and lower limits. The selected upper limit data points form an upper limit mask and the lower limit data points form a lower limit mask. When the upper and lower limit data masks are combined and translated back to frequency/amplitude units from the pixel map, they form an envelope mask.

3 Claims, 8 Drawing Sheets

AUTOMATIC GENERATION OF FREQUENCY DOMAIN MASK

BACKGROUND OF THE INVENTION

The present invention relates to the analysis of frequency domain data, and more particularly to automatic generation of a frequency domain mask for pass/fail analysis of frequency domain data.

Some frequency domain instruments, such as radio frequency (RF) spectrum analyzers, while displaying frequency domain traces for a signal, also support an optional display of a pass/fail mask shape while the instrument is acquiring the signal. If any part of the frequency spectrum of the signal is above the mask ("upper limit" mask) or below the mask ("lower limit" mask), the instrument uses some means for alerting a user about the mask failure, such as by providing a warning light, message on the display, beep, saving a data file for the signal, etc. Most masks in common use are specified manually by the user, i.e., by drawing lines in a user interface window, entering numeric values from a keyboard, etc. Alternatively the mask may be chosen from manufacturer provided preset values, such as a channel mask for a given signal standard.

A more flexible alternative for generating masks is to acquire some representative real-world signal and invoke an auto-generation function to build a mask that conforms to the shape of the sampled frequency domain data for the signal, but is spaced from it by a user-specified frequency offset in one direction, such as the X-axis, and amplitude offset in the orthogonal direction, such as the Y-axis. Auto-generation techniques for masks typically generate only one kind of mask at a time, usually an upper limit mask. One example is the Y400/YBT250 RF Scout® Interference Hunter spectrum analyzer manufactured by Tektronix, Inc. of Beaverton, Oreg. which uses X and Y offsets together in one drawing phase.

BRIEF SUMMARY OF THE INVENTION

Embodiments of the present invention provide the ability to automatically generate an upper limit mask, or a lower limit mask, using a two step process that provides blurring along the frequency axis based upon a frequency offset, and separately adjusting the amplitude based upon an amplitude offset. Further embodiments, as described herein, provide automatic generation of an envelope mask for frequency domain data, which envelope mask includes both upper and lower limits.

Accordingly, embodiments of the present invention provide an automatic generation of a frequency domain envelope mask by drawing a reduced waveform, representing frequency domain data in frequency/amplitude units for an input signal, into a bit-map, also referred to herein as a pixel map or virtual image. The reduced waveform is blurred by applying a user selected frequency offset to the reduced waveform within the pixel map. By searching from either the top or bottom of the pixel map, data points are found for either upper or lower limits, which data points are decimated. From the decimated data points, "interesting" data points are selected and then translated from the pixel map back to frequency/amplitude units. The resulting upper and lower limit masks formed by the interesting data points are shifted by a user selected amplitude offset. Each upper and lower limit mask is formed separately by, for example, first searching from the top to find the upper limit data points and generating the upper limit mask, and then searching from the bottom to find the lower limit data points and generating the lower limit mask. The upper and lower limit masks, if desired, are combined to form the envelope mask which may be used for display and analysis of subsequently acquired input signals.

The objects, advantages and other novel features of the present invention are apparent from the following detailed description when read in conjunction with the appended claims and attached drawing.

DETAILED DESCRIPTION OF THE INVENTION

Figure 1:
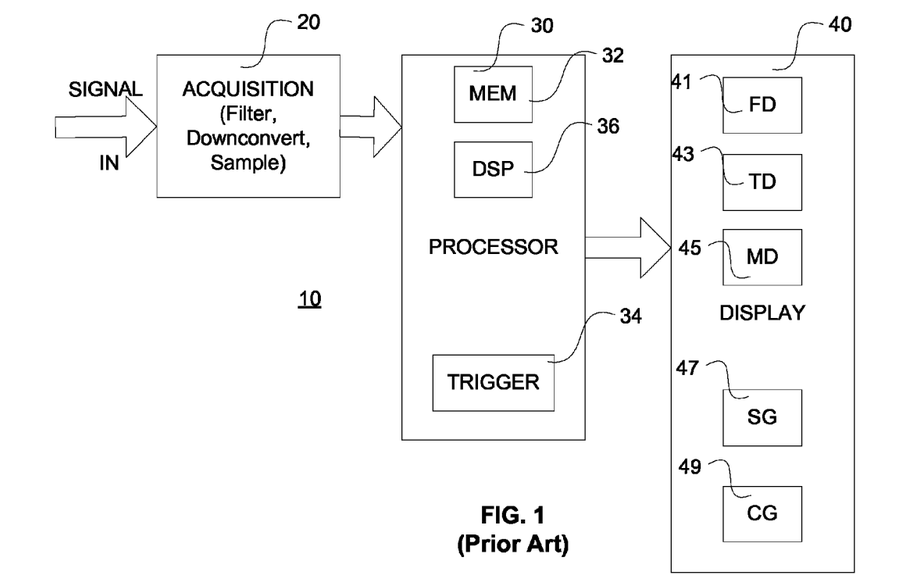
FIG. 1 is a hardware block diagram of a typical spectrum analyzer according to the prior art.

Referring now to FIG. 1 (Prior Art) a signal to be analyzed is input to a measurement instrument 10 which includes frequency domain analysis capabilities. An acquisition system 20 receives the input signal, frequency converts and filters the input signal to produce an intermediate frequency signal, and then digitizes the intermediate frequency signal to produce digital data. The digital data is input to a processor 30 that includes a memory 32, a trigger system 34 and a digital signal processor (DSP) 36. The digital data, in response to a trigger signal from the trigger system 34, is stored in the memory 32 as acquired data representing the input signal in the time domain. The acquired data is subsequently processed by the DSP 36 to produce display data. The display data is input to a display device 40 and may produce one of several types of display, for example, a frequency domain (FD) display (frequency versus amplitude) 41, a time domain (TD) display (time versus amplitude) 43, a modulation display (MD) 45, a spectrogram (SG) display 47 and/or a codogram (CG) display 49 to name a few. The current invention relates to the frequency domain display 41, and more particularly to the automatic generation of a frequency domain mask, especially an envelope mask, for the frequency domain data representing the input signal.

Figure 2:
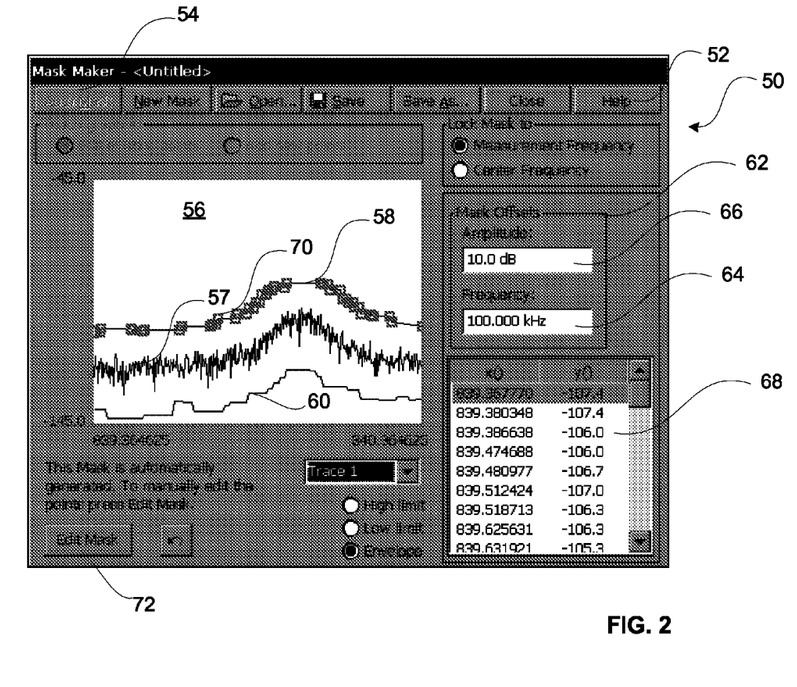
FIG. 2 is a plan view of an instrument display using frequency domain envelope mask auto-generation according to an embodiment of the present invention.

A screen display 50 appears in FIG. 2 for the instrument of FIG. 1 having a tool bar 52 at the top that includes an auto-mask selection button 54, shown activated. A frequency domain display 56 includes the frequency domain waveform 57 reflecting the acquired data for the input signal as converted from the time domain to the frequency domain. Also shown on the frequency domain display 56 are an upper limit mask 58 and a lower limit mask 60, which together form the envelope mask and are automatically generated as described below. To the right of the frequency domain display is shown a mask offset region 62 that reflects user input offsets for both frequency 64 and amplitude 66. Data point values for the upper limit mask 58 are shown in a lower right window 68 and correspond to the data points 70, represented as squares in this embodiment, on the upper limit mask. The upper limit mask 58 is referenced as Trace 1 in this example, whereas the lower limit mask 60 may be Trace 2. For conservation of space the data point values for only one of the Traces is shown in the lower right window 68, although with sufficient display space the data point values for both Traces may be shown. Once generated the upper and lower limit masks 58, 60 may be manually edited by accessing the Edit Mask button 72, as in U.S. Pat. No. 7,159,187. The auto-generated upper and lower limit masks 58, 60 form the envelope mask for the frequency domain version of the input signal.

Figure 3A:
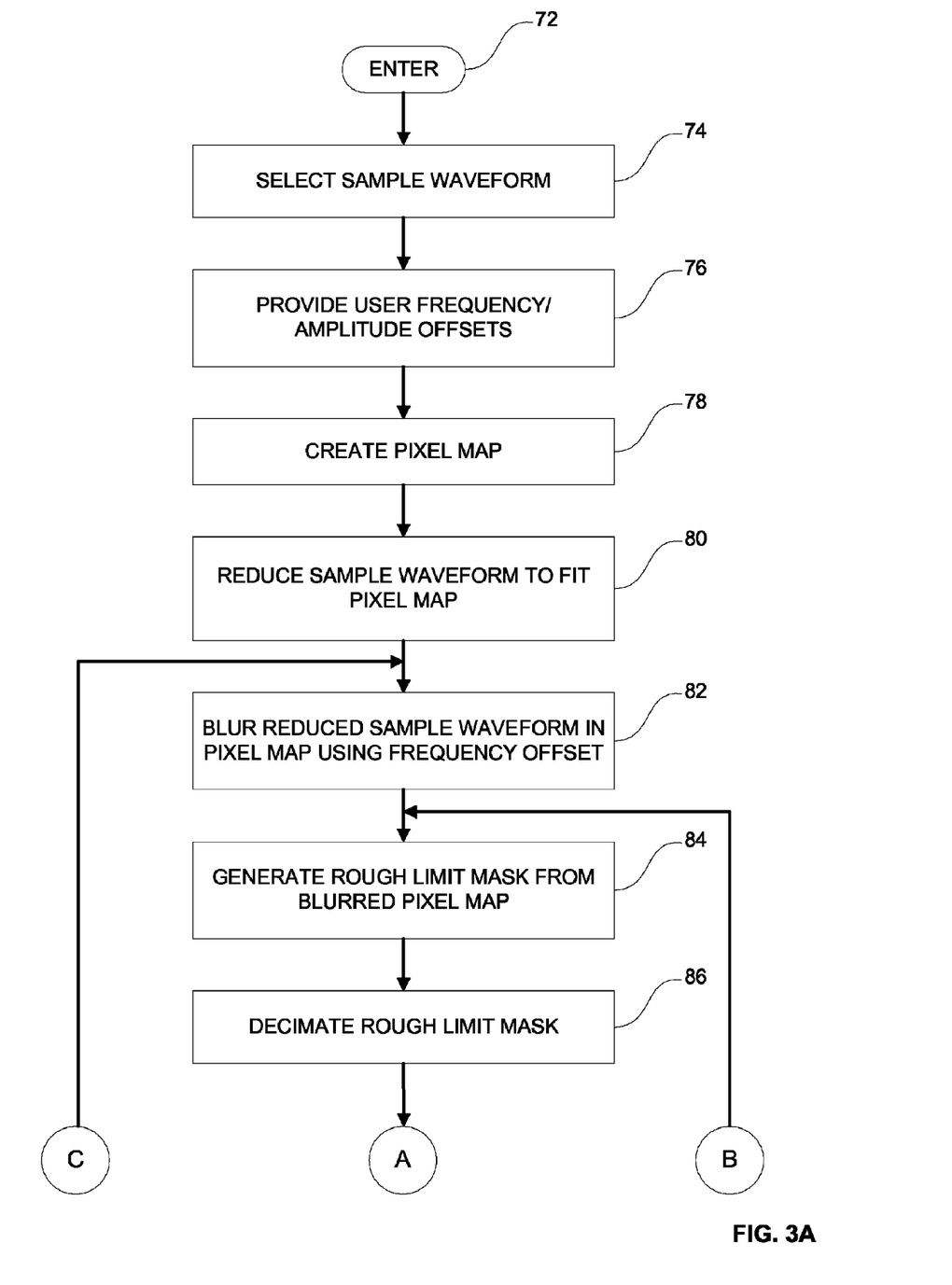
FIGS. 3A and 3B are a flow chart view of frequency domain envelope mask auto-generation according to an embodiment of the present invention.
Figure 3B:
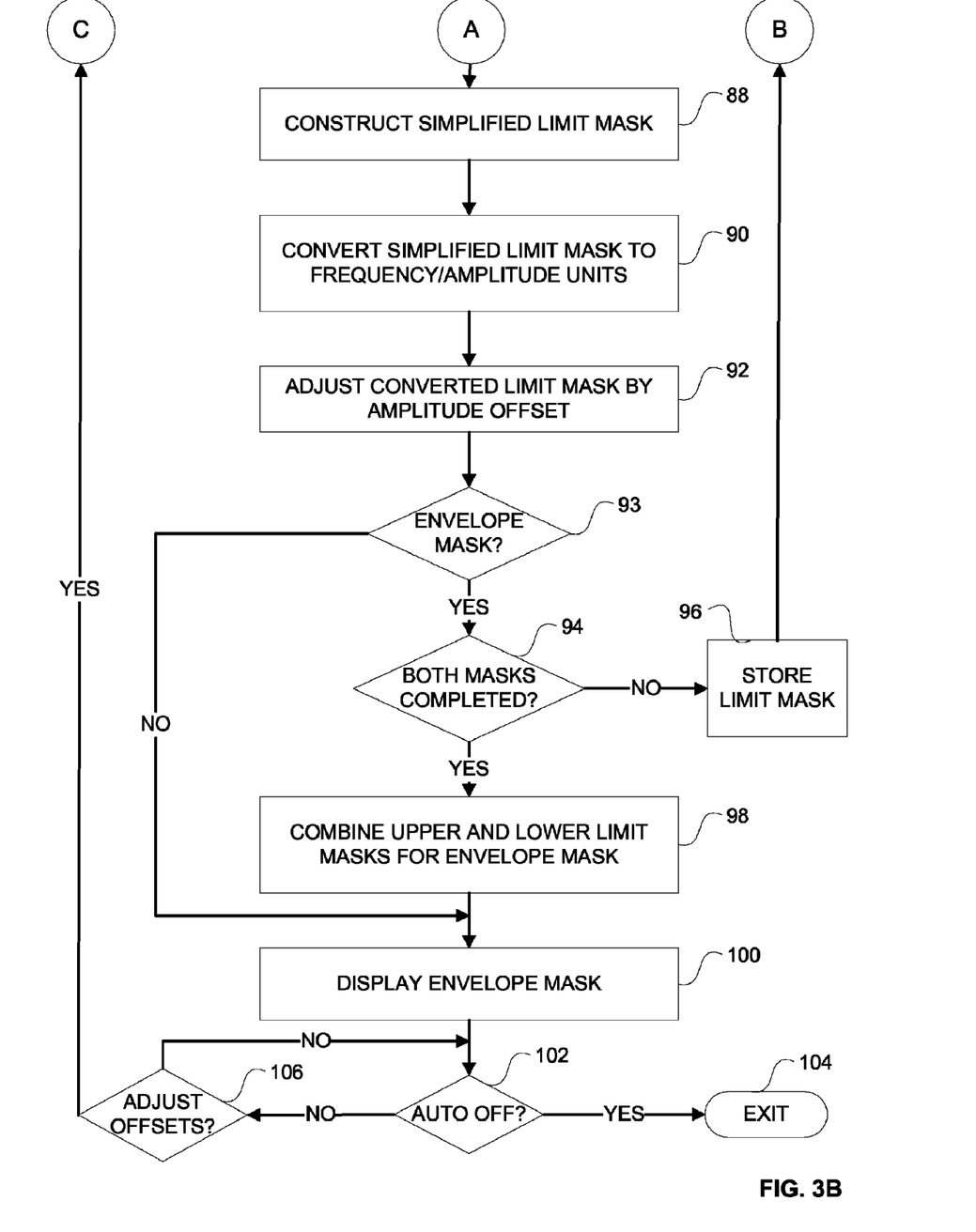
Figure 4A:
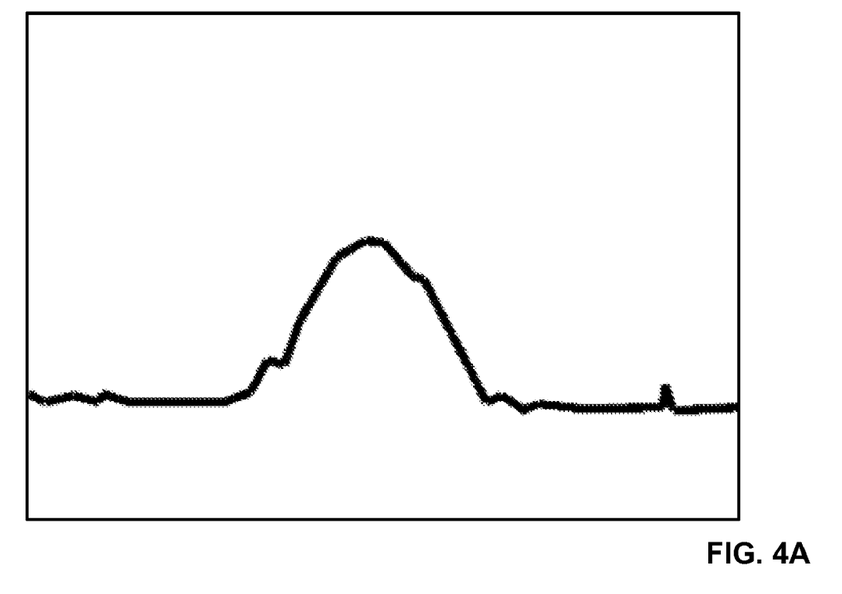
FIGS. 4A-4I are graphic views illustrating the frequency domain envelope mask auto-generation according to an embodiment of the present invention.
Figure 4B:
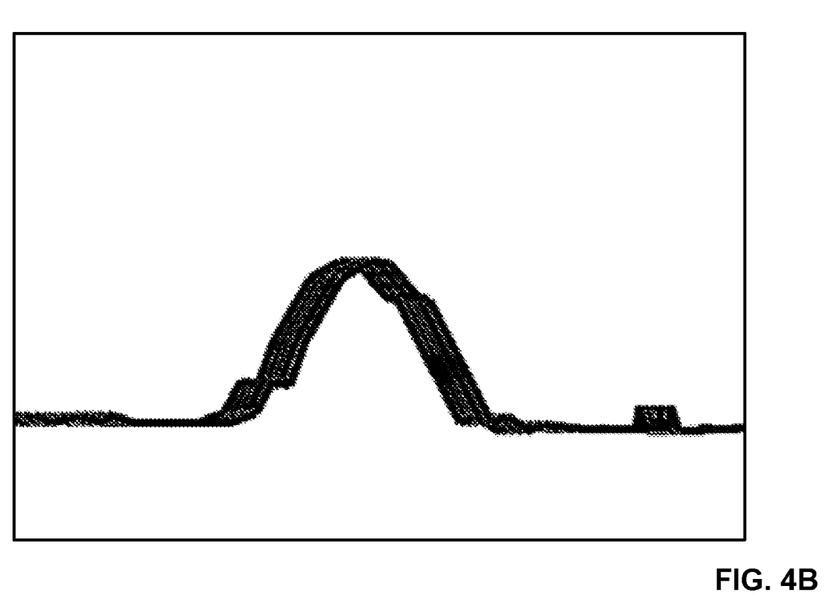

FIGS. 3A and 3B show a method of auto-generating the frequency domain limit masks 58, 60. FIGS. 4A through 4I provide further illustration of the steps of performing the method according to an embodiment of the present method. The mask auto-generation function is entered (step 72) in response to activation of the auto-mask button 54 on the frequency domain display 50. A sample waveform (FIG. 4A) for use in generating the limit mask(s) is first selected (step 74), either from the acquired data in the memory 32 or from a calibrated signal supplied by a manufacturer acquired from a test signal generator according to a desired frequency domain standard for the input signal to be analyzed. The user then enters desired mask offsets via the user interface 66 (step 76). The auto-mask generation function then creates a pixel map (step 78) in the form of an M×N pixel bit-map. The selected waveform frequency domain data is reduced to fit within the pixel map (step 80). For example if the waveform frequency domain data has 100 data points along the frequency axis and the bit-map is 20 pixels along the same axis, groups of five frequency domain data points are combined into a single pixel value in the pixel map. The reduced frequency domain waveform is than drawn within the pixel map using the frequency offset (step 82) to produce in this example a blurred image that has thick generally vertical lines and narrow generally horizontal lines (FIG. 4B). The thickness in pixels of each line segment is:

$$\text{Thickness} = (\text{Angle}/(\pi/2)) * X\_\text{Thickness}$$

where X_Thickness is the user specified frequency offset converted from frequency units to pixels in the pixel map. The actual generation may be accomplished by adding a number of pixels along the frequency axis plus and minus for each reduced waveform data point when the reduced waveform is drawn into the pixel map, i.e., if the frequency range of the frequency domain data is 100 MHz, then each pixel interval within the pixel map represents 5 MHz so that for a 10 MHz frequency offset two pixels on either side of the frequency domain data point are added to the pixel map. Alternatively the blurred reduced waveform image may be generated by drawing the reduced waveform data into the pixel map, and redrawing the reduced waveform data—shifted left from the original reduced waveform by two pixels and again shifted right from the original reduced waveform by two pixels. Other techniques for blurring may be used, giving consideration to computational efficiency.

Figure 4C:
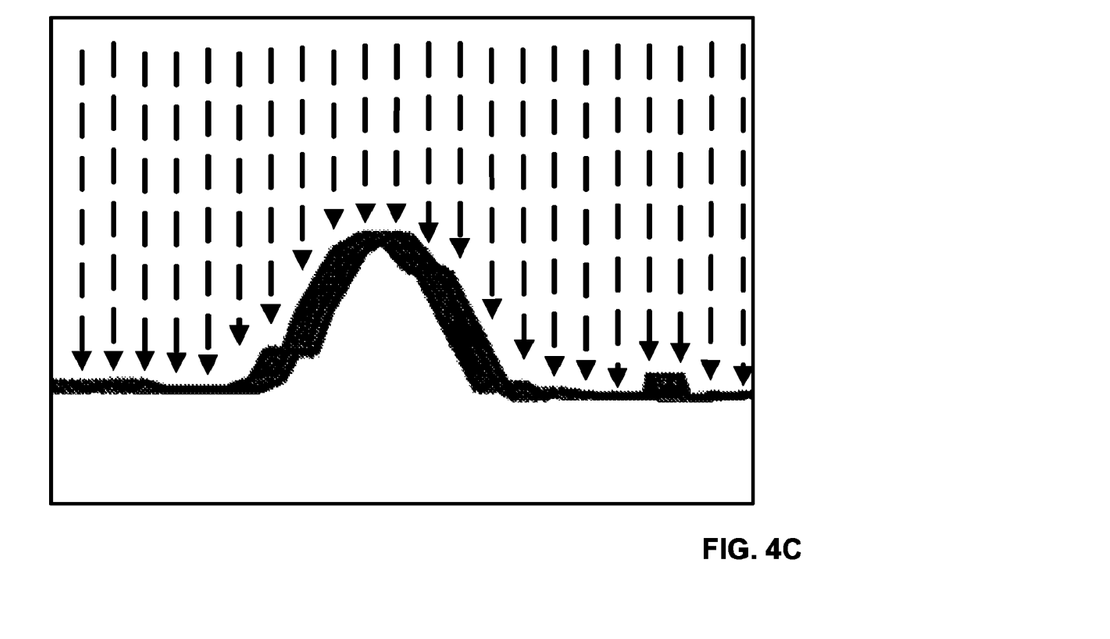
Figure 4D:
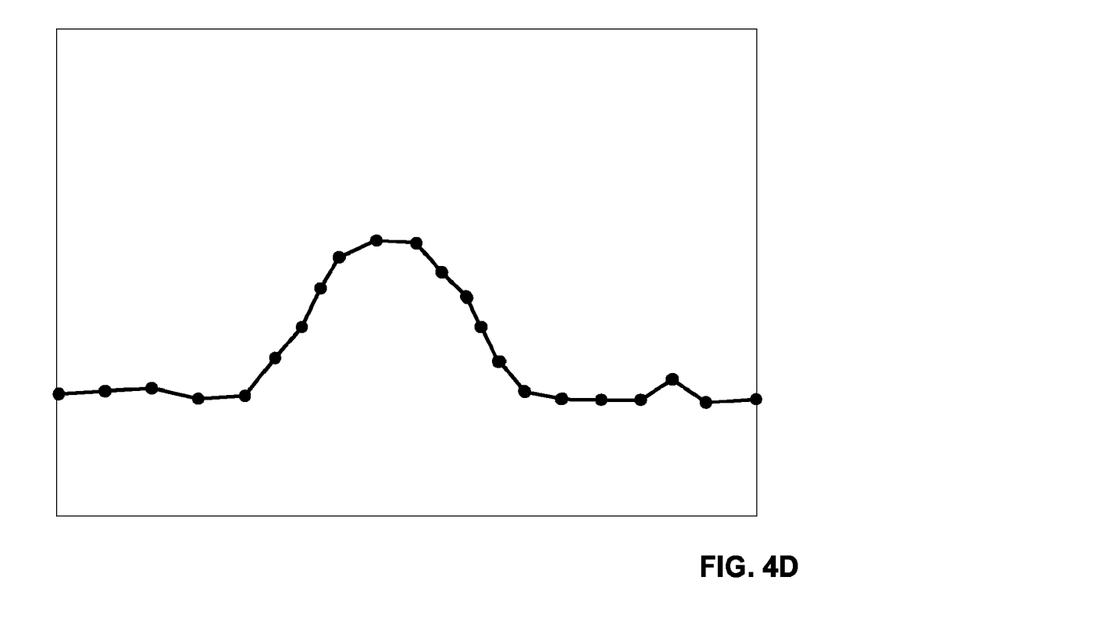
Figure 4E:
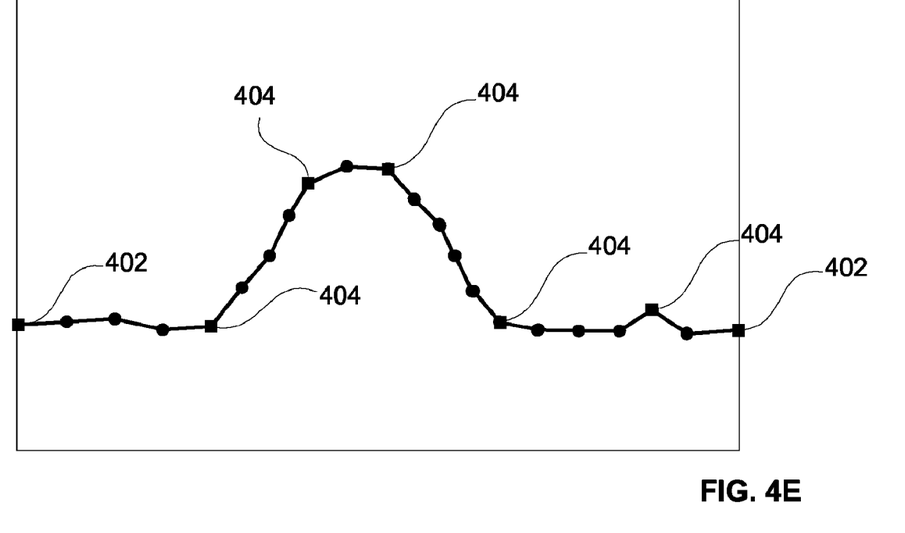
Figure 4F:
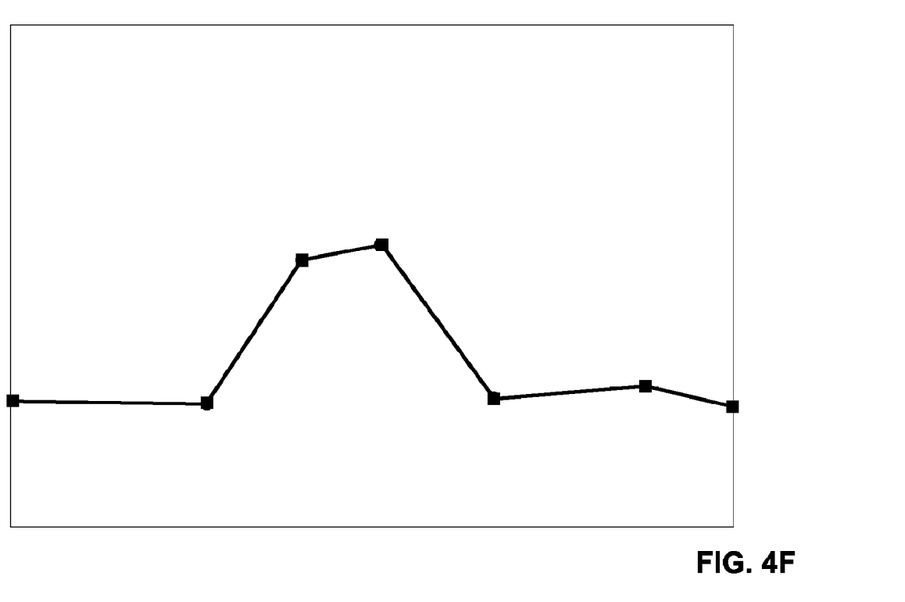
Figure 4G:
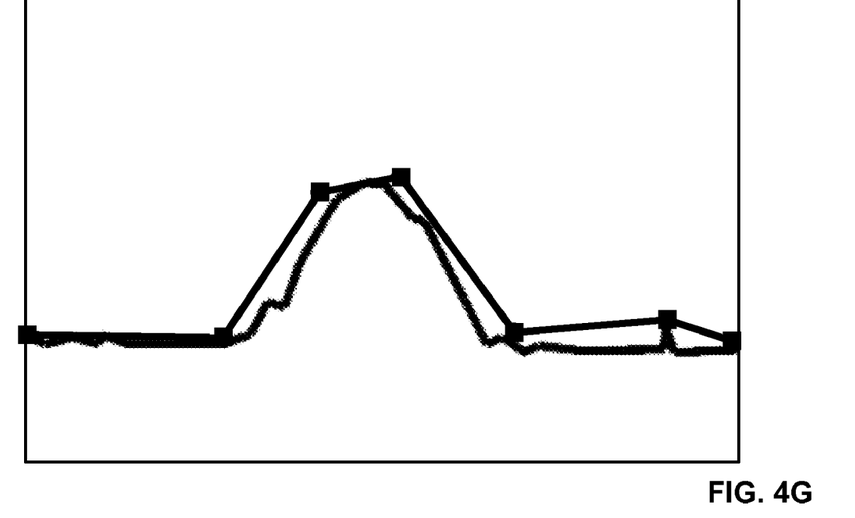
Figure 4H:
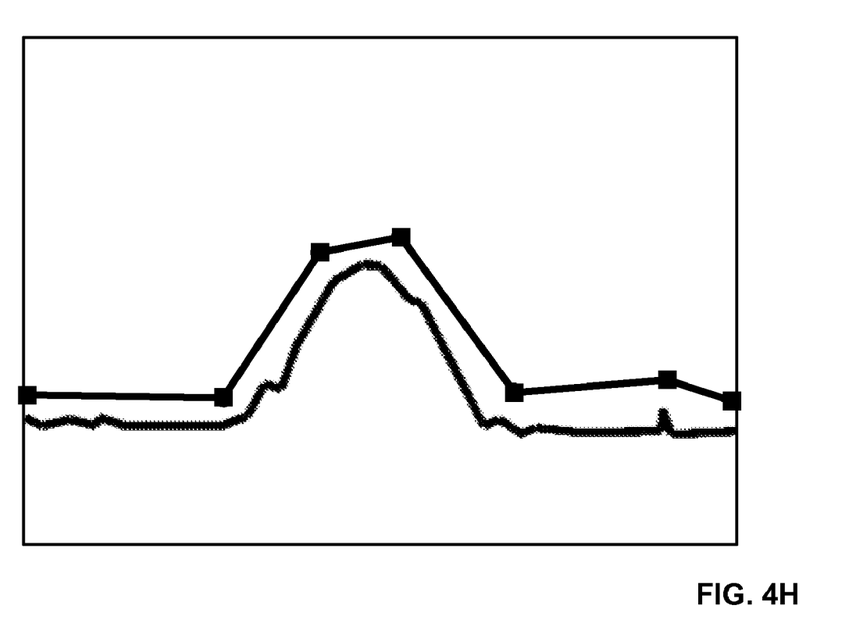
Figure 4I:
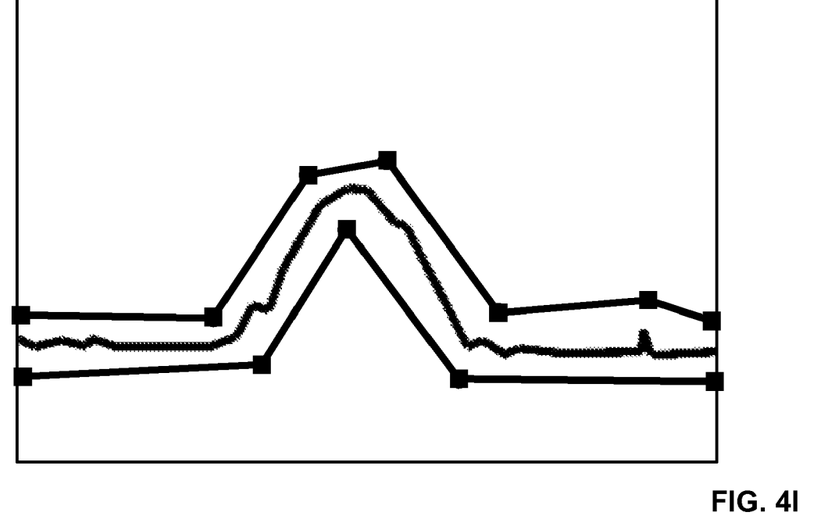

A search is then conducted from either the top or bottom of the pixel map, depending upon which limit mask, upper or lower, is being generated, to find the first data point in the blurred image for each horizontal pixel location of the pixel map (step 84) to form a rough limit mask. FIG. 4C illustrates searching from the top to generate an upper limit mask. The dotted lines are shown to illustrate the direction of searching, and would not be generated as part of the pixel map. The rough limit mask is subsequently simplified by grouping a series of horizontal pixels together and finding the maximum/minimum value as a mask data point for the rough limit mask (step 86) (FIG. 4D). A simplified limit mask is constructed by keeping only interesting mask data points of the decimated rough limit mask (step 88). The first and last points 402 in the decimated rough limit mask are considered interesting, as are any points 404 whose second derivative's absolute value exceeds a fixed fraction of the maximum of the absolute values of all the second derivatives, i.e., inflection points in the frequency domain data (FIG. 4E). The resulting simplified limit mask (FIG. 4F) is produced. The interesting data points may be filtered to smooth the resulting limit mask image when displayed. Next the simplified limit mask is converted from the pixels of the pixel map to the frequency and amplitude units (step 90) (FIG. 4G) of the original frequency domain data to produce the limit mask. Now the user selected amplitude offset is applied to shift the limit mask up/down (step 92) (FIG. 4H). If an envelope mask is desired (step 93), a test is made to determine whether both limit masks have been generated (step 94) and, if not, the first limit mask is stored (step 96) and the function repeats steps 84-92 to generate the other limit mask (FIG. 4I). If the test at step 94 indicates both limit masks (upper and lower) are generated, the two limit masks are combined at step 98 in storage from which they may subsequently be displayed (step 100) together with the frequency domain waveform for the input signal.

Figure 5:
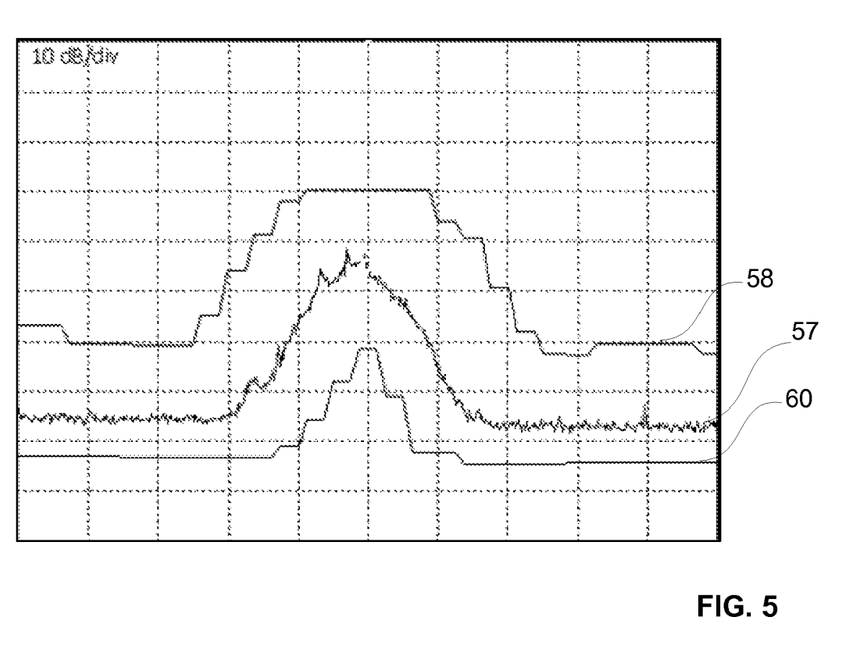
FIG. 5 is a graphic view of a frequency domain envelope mask produced according to an embodiment of the present invention.

If mask auto-generation is turned off (step 102), the function exits (step 104). If the mask auto-generation is still on and either or both of the offsets are adjusted (step 106), the function returns to step 82 and repeats the mask auto-generation until the auto-generation function is turned off. The result is a limit mask that is automatically generated to produce, if an envelope mask is desired, both upper and lower limits simultaneously in response to selected frequency domain waveform data and user selected frequency and amplitude offsets. FIG. 5 illustrates an upper mask 58 and a lower mask 60 along with the frequency domain waveform 57.

Thus the present invention provides an automated generation of a frequency domain mask from a selected input signal by drawing reduced frequency domain waveform data into a virtual, bit-map image, blurring the reduced waveform in one dimension by the frequency offset, generating limit mask points from the blurred waveform, translating the mask points to the frequency/amplitude units, shifting the mask points by the amplitude offset, and repeating the same steps for the other limit mask if an envelope mask is desired, the two limit masks being combined as the envelope mask for display with the frequency domain waveform representing the input signal.

What is claimed is:

1. A method of auto-generating a frequency domain mask of a measurement instrument for a selected input signal comprising the steps of:

reducing frequency domain data representing the selected input signal to fit within a pixel map by converting frequency/amplitude units to pixel units in the pixel map to produce a reduced waveform;

drawing the reduced waveform within the pixel map using a user selected frequency offset to produce a blurred waveform;

selecting data points for the frequency domain mask from the blurred waveform;

converting the data points from the pixel map to frequency/amplitude units; and adjusting the converted data points using a user selected amplitude offset to produce the frequency domain mask.

2. The method as recited in claim 1 comprising the steps of:
repeating the selecting, converting and adjusting steps to produce an upper limit mask and a lower limit mask; and
combining the upper limit mask and the lower limit mask to form an envelope mask for use in analyzing subsequently acquired input signals.

3. The method as recited in claim 2 wherein the selecting step comprises the steps of:

searching from the top of the pixel map down until a data point is detected to select data points for the upper limit mask; and
searching from the bottom of the pixel map up until a data point is detected to select data points for the lower limit mask.

\* \* \* \* \*